(12) United States Patent
Jang et al.

(10) Patent No.: US 10,452,098 B2
(45) Date of Patent: Oct. 22, 2019

(54) FOLDABLE DISPLAY APPARATUS AND METHOD OF MANUFACTURING THE SAME

(71) Applicant: Samsung Display Co., Ltd., Yongin-Si, Gyeonggi-Do (KR)

(72) Inventors: Mi Jang, Yongin-si (KR); Minjung Lee, Yongin-si (KR); Haseok Jeon, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 16/113,997

(22) Filed: Aug. 27, 2018

(65) Prior Publication Data

US 2019/0250662 A1    Aug. 15, 2019

(30) Foreign Application Priority Data

Feb. 14, 2018   (KR) ...................... 10-2018-0018686

(51) Int. Cl.
| | | |
|---|---|---|
| *H01J 1/62* | (2006.01) | |
| *G06F 1/16* | (2006.01) | |
| *H01L 27/12* | (2006.01) | |
| *H01L 27/32* | (2006.01) | |

(52) U.S. Cl.
CPC .......... *G06F 1/1616* (2013.01); *G06F 1/1652* (2013.01); *H01L 27/1214* (2013.01); *H01L 27/3246* (2013.01)

(58) Field of Classification Search
None
See application file for complete search history.

(56) References Cited

U.S. PATENT DOCUMENTS

| | | | |
|---|---|---|---|
| 7,446,757 B2 * | 11/2008 | Mochizuki | ............ G06F 1/1616 345/168 |
| 9,772,501 B2 | 9/2017 | Koito et al. | |
| 2015/0346776 A1 * | 12/2015 | Miyake | ................. G06F 1/1652 345/174 |
| 2016/0070303 A1 * | 3/2016 | Lee | ....................... G06F 1/1616 361/679.27 |

FOREIGN PATENT DOCUMENTS

| | | |
|---|---|---|
| JP | 2004-126197 A | 4/2004 |
| JP | 5923456 B2 | 5/2016 |
| KR | 10-2005-0068269 A | 7/2005 |
| KR | 10-2016-0059505 A | 5/2016 |
| KR | 10-2017-0080311 A | 7/2017 |

* cited by examiner

*Primary Examiner* — Vip Patel
(74) *Attorney, Agent, or Firm* — Innovation Counsel LLP

(57) ABSTRACT

Provided is a foldable display apparatus, whereby an arrangement line connecting plurality of spacers via a virtual straight line is not arranged in parallel to a folding axis.

20 Claims, 5 Drawing Sheets

FOLDABLE DISPLAY APPARATUS AND METHOD OF MANUFACTURING THE SAME

CROSS-REFERENCE TO RELATED APPLICATION

This application claims the benefit of Korean Patent Application No. 10-2018-0018686, filed on Feb. 14, 2018, in the Korean Intellectual Property Office, the disclosure of which is incorporated herein in its entirety by reference.

BACKGROUND

1. Field

One or more embodiments relate to a foldable display apparatus having a main body that is foldable or unfoldable according to necessity, and a method of manufacturing the foldable display apparatus.

2. Description of the Related Art

For example, a display apparatus, such as an organic light-emitting display apparatus, may have a characteristic of being flexibly changeable, and thus, the display apparatus may be manufactured to have a foldable structure for convenience of portability.

However, when the foldable display apparatus is continually folded and unfolded, stress is repeatedly applied around a folding axis to cause cracks to occur, and particularly, it is known that a concentration of spacers formed to mount a deposition mask may affect the occurrence of cracks. When the cracks are distributed, it may damage a product to an extent in which the product does not normally operate. Thus, an appropriate solution is required.

SUMMARY

One or more embodiments include a foldable display apparatus improved to suppress occurrence and distribution of cracks in a folding axis, and a method of manufacturing the foldable display apparatus.

Additional aspects will be set forth in part in the description which follows and, in part, will be apparent from the description, or may be learned by practice of the presented embodiments.

According to one or more embodiments, a foldable display apparatus includes: a panel body comprising a folding portion which is foldable with respect to a folding axis, a plurality of pixels arranged in the panel body, and two or more spacers arranged between respective ones of the plurality of pixels of the panel body, wherein a first arrangement line connecting the two or more spacers in the folding portion via a virtual straight line is not parallel to the folding axis.

A number of the two or more spacers arranged in a line parallel to the folding axis in the folding portion may be equal to two.

A second arrangement line connecting the plurality of pixels in the folding portion via a virtual straight line may not be parallel to the first arrangement line.

The plurality of pixels and the two or more spacers may be arranged in a plurality-to-one correspondence.

The plurality of pixels may include a pixel-defining layer defining an emission area, and a thin film encapsulation layer covering and protecting the emission area, and the two or more spacers may be arranged between the pixel-defining layer and the thin film encapsulation layer.

The thin film encapsulation layer may include a multi-layer in which an organic layer and an inorganic layer are stacked.

The thin film encapsulation layer may include a single inorganic layer.

The first arrangement line and the second arrangement line may maintain the same arrangement pattern in areas except for the folding portion of the panel body.

The first arrangement line and the second arrangement line may have a different arrangement pattern in areas except for the folding portion of the panel body.

The two or more spacers may be configured to mount a deposition mask.

According to one or more embodiments, a method of manufacturing a foldable display apparatus includes: forming a plurality of pixels in a panel body comprising a folding portion foldable with respect to a folding axis; and forming two or more spacers between the respective ones of plurality of pixels of the panel body, wherein a first arrangement line connecting the two or more spacers in the folding portion via a virtual straight line is not parallel to the folding axis.

A number of the two or more spacers arranged in a line parallel to the folding axis in the folding portion may be equal to two.

A second arrangement line connecting the plurality of pixels in the folding portion via a virtual straight line may not be parallel to the first arrangement line.

The plurality of pixels and the two or more spacers may be arranged in a plurality-to-one correspondence.

The plurality of pixels may include a pixel-defining layer defining an emission area, and a thin film encapsulation layer covering and protecting the emission area, and the two or more spacers may be arranged between the pixel-defining layer and the thin film encapsulation layer.

The thin film encapsulation layer may include a multi-layer in which an organic layer and an inorganic layer are stacked.

The thin film encapsulation layer may include a single inorganic layer.

The first arrangement line and the second arrangement line may maintain the same arrangement pattern in areas except for the folding portion of the panel body.

The first arrangement line and the second arrangement line may have a different arrangement pattern in areas except for the folding portion of the panel body.

The two or more spacers may be configured to mount a deposition mask.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
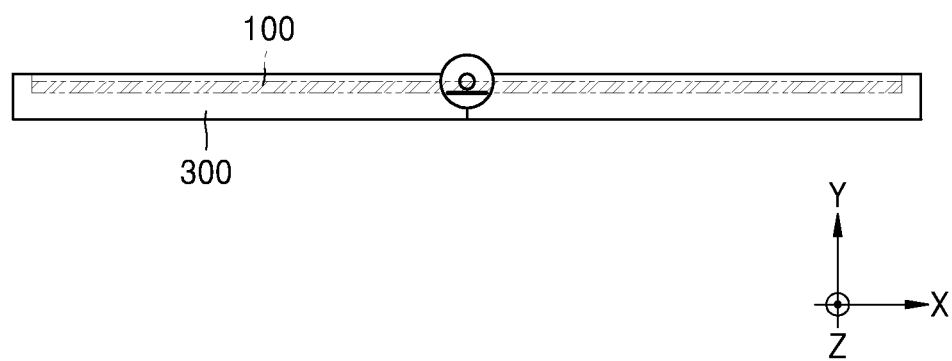
FIG. 1 is a side view showing an unfolded state of a foldable display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

Figure 2:
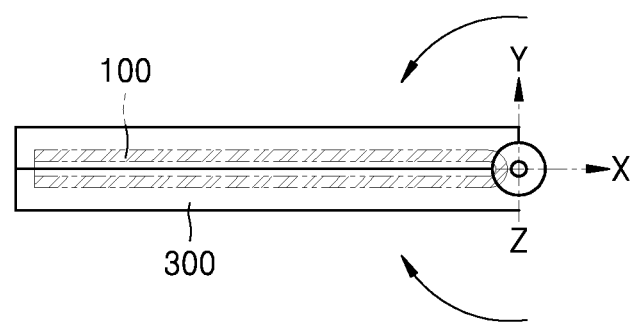
FIG. 2 is a side view showing a folded state of the foldable display apparatus illustrated in FIG. 1.

FIGS. 1 and 2 illustrate an unfolded state and a folded state, respectively, of a foldable display apparatus according to an embodiment.

The foldable display apparatus may include a panel body 100 which may be flexibly bent. Generally, the panel body 100 may include a structure (refer to FIG. 6) in which a thin film transistor and a light-emitting device for realizing an image on a flexible substrate, a thin film encapsulation layer covering and protecting the thin film transistor and the light-emitting device, etc. are stacked. Since the flexible substrate is used rather than a rigid glass substrate, the panel body 100 may be freely folded and unfolded with a permitted extent of flexibility. Thus, the foldable display apparatus may be in a folded state as illustrated in FIG. 2.

Also, the panel body 100 may be supported by a case 300 to be foldable and unfoldable, as illustrated in FIGS. 1 and 2, and the panel body 100 may be folded or unfolded along with rotation of the case 300.

Figure 3:
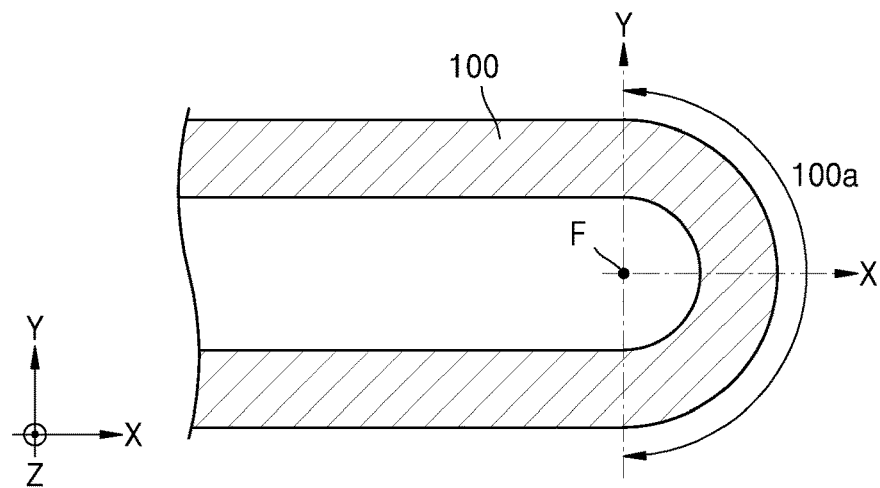
FIG. 3 is a side view showing an unfolded state of a panel body of the foldable display apparatus illustrated in FIG. 1.
Figure 4:
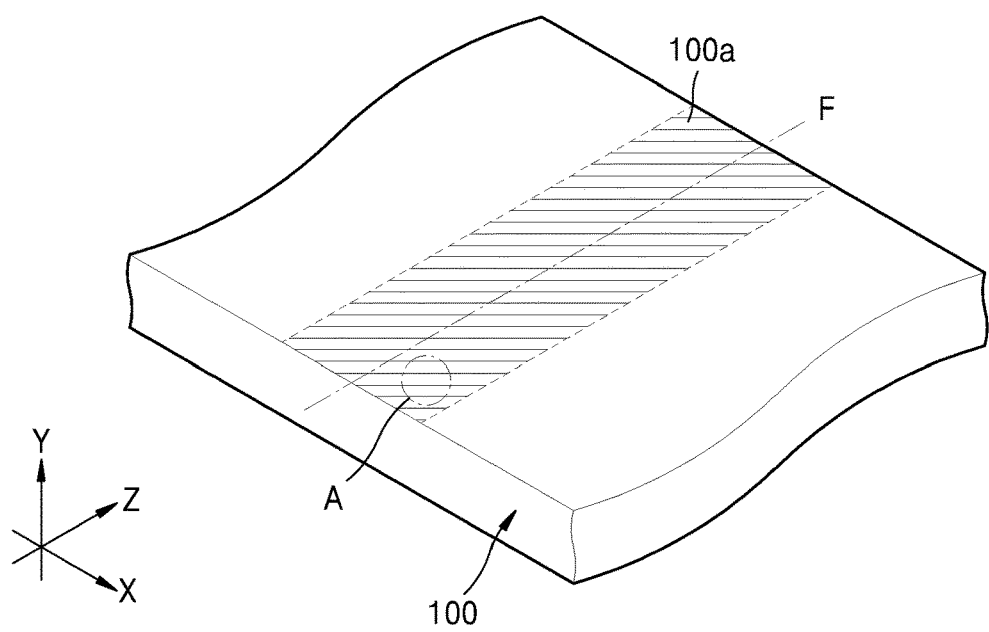
FIG. 4 is a perspective view of the panel body illustrated in FIG. 3.

Meanwhile, as illustrated in FIGS. 3 and 4, compression stress and tensile stress may be applied to a folding portion 100a of the panel body 100, repeatedly bent and straightened when the panel body 100 is folded and unfolded as described above. That is, when the panel body 100 is in a folded state as illustrated in FIG. 3, compression stress may be applied to an inner surface of the folding portion 100a, and tensile stress may be applied to an outer surface of the folding portion 100a. As such, when the stress forces in different directions are repeatedly applied to the folding portion 100a, cracks may occur in the folding portion 100a and may be distributed. In particular, when spacers 120 (refer to FIG. 5) are concentrated in the folding portion 100a in parallel to a folding axis F, the possibility of the occurrence of cracks may be increased. The spacers 120 are formed around pixels 110 (refer to FIG. 5) to protrude from the pixels 110, so as to mount a mask (not shown) thereabove when a thin film, such as an emission layer of the pixels 110, is deposited, so that damage caused by a direct contact between the mask and the pixels 110 is prevented. When the panel body 100 is folded, the spacers 120 that protrude apply a relatively great pressure to a thin film encapsulation layer in the folding portion 100a, and thus, cracks may easily occur in the folding portion 100a.

To understand this principle, first, a sectional structure of the pixels 110 and the spacers 120 will be described, with reference to FIG. 6.

Figure 6:
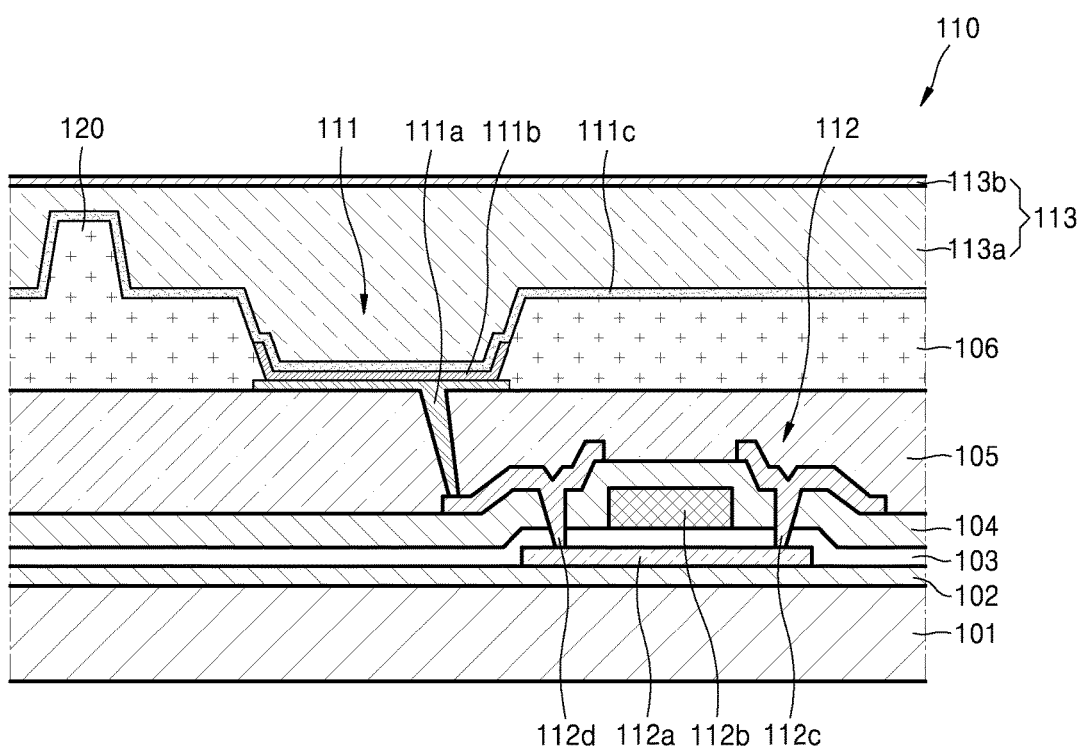
FIG. 6 is a cross-sectional view of an internal structure of a pixel and a spacer illustrated in FIG. 5.

A thin film transistor 112 and an organic light-emitting device (OLED) 111 are provided in each pixel 110 as illustrated in FIG. 6. First, regarding a structure of the thin film transistor 112, an active layer 112a is formed above a buffer layer 102 adjacent to a flexible substrate 101, wherein the active layer 112a has a source area and a drain area which are heavily doped with n-type or p-type impurities. The active layer 112a may include an oxide semiconductor. For example, the oxide semiconductor may include an oxide of a material selected from Groups 12, 13, and 14 metal elements, such as Zn, In, Ga, Sn, Cd, and Ge, and a combination thereof. For example, the active layer 112a may include G-I-Z-O [$(In_2O_3)a(Ga_2O_3)b(ZnO)c$] (where a, b, and c are real numbers satisfying the conditions of a≥0, b≥0, and c>0, respectively.) A gate electrode 112b is formed above the active layer 112a with a gate insulating layer 103 between the gate electrode 112b and the active layer 112a. A source electrode 112c and a drain electrode 112d are formed above at least a portion of the gate electrode 112b. An interlayer insulating layer 104 is formed between the gate electrode 112b, and the source electrode 112c and the drain electrode 112d, and a passivation layer 105 is between the source electrode 112c and the drain electrode 112d, and an anode 111a of the OLED 111.

An insulating pixel-defining layer 106 is formed above the anode 111a, and the OLED 111 is formed after forming a certain opening in the pixel-defining layer 106.

The OLED 111 is configured to display certain image information by emitting red light, green light, and blue light according to the current flow. In addition, the OLED 111 includes the anode 111a connected to the drain electrode 112d of the thin film transistor 112 and receiving a positive power supply from the drain electrode 112d, a cathode 111c provided to cover all the pixels 110 and supplying a negative power supply to the pixels 110, an emission layer 111b arranged between the anode 111a and the cathode 111c and emitting light.

A hole injection layer (HIL), a hole transport layer (HTL), an electron transport layer (ETL), an electron injection layer (EIL), etc. may be stacked to be adjacent to the emission layer 111b of the OLED 111.

For reference, the emission layer 111b may be formed for each color, such that pixels emitting red, green, and blue light collectively form one unit pixel. Alternatively, the emission layer 111b may be commonly formed throughout all the pixel areas regardless of locations of the pixels. Here, the emission layer 111b may include layers including emission materials for emitting red, green, and blue light, which are vertically stacked or mixed. However, a combination of other colors, which emits white light, is also possible. Also, a color conversion layer or a color filter configured to convert the emitted white light into a certain color may further be included.

In addition, a thin film encapsulation layer 113 in which an organic layer 113a and an inorganic layer 113b are alternately stacked is arranged above the cathode 111c to cover and protect the pixels 110. The organic layer 113a mainly planarizes unevenness of layers below the organic layer 113a and provides flexibility to the lower layers, and the inorganic layer 113b functions as a barrier to prevent penetration of water and oxygen from the outside. According to the case, the thin film encapsulation layer 113 may be formed as a single inorganic layer 113b, omitting the organic layer 113a.

Here, reference number 120 indicates a spacer in which a mask (not shown) is mounted when the emission layer 111b, etc. are deposited, as described above, wherein the spacer 120 may be formed as a protruding shape of the pixel-defining layer 106.

Since the spacer 120 protrudes as such compared to other components nearby, the spacer 120 may apply a greater pressure to the thin film encapsulation layer 113 than the other components, when stress is applied to the thin film encapsulation layer 113 due to folding, etc. Thus, when the folding is repeated in a location of the thin film encapsulation layer 113, in which the spacer 120 is arranged, the probability of the occurrence of cracks in the inorganic layer 113b may inevitably increase, and when the cracks occur in the inorganic layer 113b, water and oxygen may penetrate into the cracks from the outside, so as to easily deteriorate the emission layer 111b and cause defects thereof.

Thus, it is critical to decrease the risk of defects caused by the occurrence of cracks, to distribute the spacers 120 in the folding portion 100a along the folding axis F based on which the folding is performed.

Figure 5:
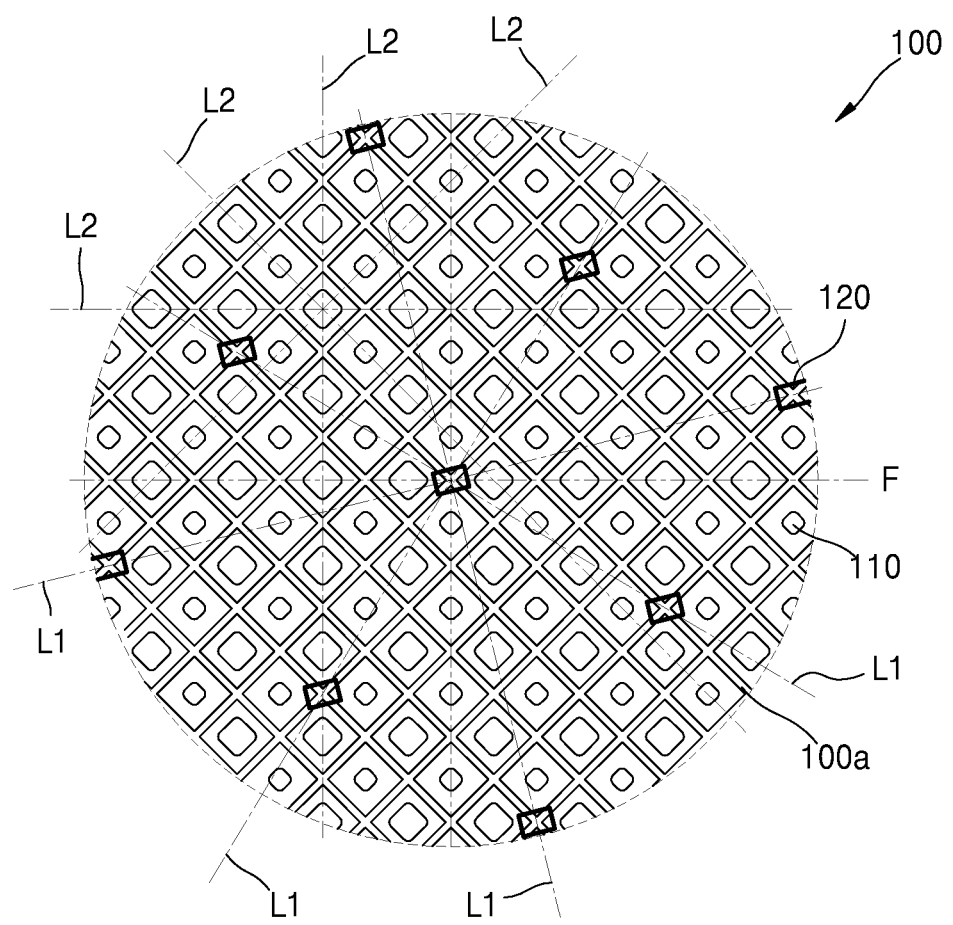
FIG. 5 is an enlarged plan view of portion A of FIG. 4.

According to the present embodiment, in order to solve this problem, the spacers 120 are arranged in the folding portion 100a as illustrated in FIG. 5. It should be understood that the spacers 120 are not illustrated in their actual shapes and sizes, but are illustrated to indicate approximate locations thereof, so that the arrangement thereof is easily understood.

Basically, the spacers 120 are not provided in a one-on-one correspondence to the pixels 110. Rather, one spacer 120 is arranged for the plurality of pixels 110. That is, the pixels 110 and the spacers 120 are arranged in a many-to-one, i.e., a plurality-to-one correspondence.

Here, assuming that virtual straight lines connecting adjacent spacers 120 are first arrangement lines L1, the first arrangement lines L1 are arranged not to be in parallel to the folding axis F. That is, a direction in which the spacers 120 are continually arranged does not correspond to a direction of the folding axis F. By doing so, the concentration of the spacers 120 may decrease in a direction parallel to the folding axis F, and thus, even if cracks occur due to folding, the cracks occur in minute local parts, so that defects are not caused by the cracks. Desirably, it is safe to distribute the spacers 120 such that three or more spacers 120 are not concentrated in one line in the direction parallel to the folding axis F, that is, two or less spacers are arranged in one line in the direction parallel to the folding axis F.

Also, reference sign L2 indicates second arrangement lines connecting adjacent pixels 110 by a virtual straight line, wherein the first arrangement lines L1 are not arranged to be parallel to the second arrangement lines L2. Generally, the pixels 110 densely included in a display area of the panel body 100 are arranged to form a column also in the direction parallel to the folding axis F, and thus, when the first arrangement lines L1 are not arranged to be parallel to the second arrangement lines L2, the first arrangement lines L1 are not arranged to be parallel to the folding axis F. The folding axis F is not clearly identified by the naked eye, and thus, by using the first and second arrangement lines L1 and L2, it may be easily identified whether the spacers 120 are arranged in the way that is intended as described above.

Thus, the occurrence of cracks in the folding portion 100a may be effectively suppressed by improving the arrangement of the spacers 120.

The foldable display apparatus having the structure described above may be manufactured as follows.

First, the plurality of pixels 110 and the one or more spacers 120 as illustrated in FIG. 6 may be formed in the panel body 10, which is foldable.

Here, as illustrated in FIG. 5, the first arrangement lines L1 and the folding axis F, and the first arrangement lines L1 and the second arrangement lines L2 may be arranged not to be parallel to each other, respectively, in the folding portion 100a. Meanwhile, a display area except for the folding portion 100a is an area which is not folded, and thus, the same pattern as the folding portion 100a may be arranged in the display area, or different patterns may be arranged in the display area. That is, in the area except for the folding portion 100a, the first arrangement lines L1 of the spacers 120 may be arranged in parallel to the folding axis F or the second arrangement lines L2 or may not be arranged in parallel to the folding axis F and the second arrangement line L2 as in the folding portion 100a. The area is not folded, and thus, the arrangement of the spacers 120 by taking into account the occurrence of cracks may not have to be complied with.

Next, the panel body 100 having the improved arrangement of the spacers 120 in the folding portion 100a may be coupled to the case 300 as illustrated in FIG. 1.

When storing or transporting the foldable display apparatus manufactured as described above, the foldable display apparatus may be folded as illustrated in FIGS. 2 and 3, and thus, large stress may be applied around the folding axis F of the panel body 100. However, since the spacers 120 are distributed and are not concentrated in the direction parallel to the folding axis F, even if folding is repeated, the possibility of the occurrence of cracks is low, and even if cracks occur, the cracks occur only in a minute local area, and thus, a product is prevented from being greatly damaged.

Also, when an image is viewed by unfolding the foldable display apparatus to be flat, the panel body 100 may be straightened to be unfolded as illustrated in FIGS. 1 and 4. Thus, the user may view a flat image via the panel body 100 that is straightened, and a reliable image without defects based on cracks may be provided in the folding portion 100a.

Figure 7:
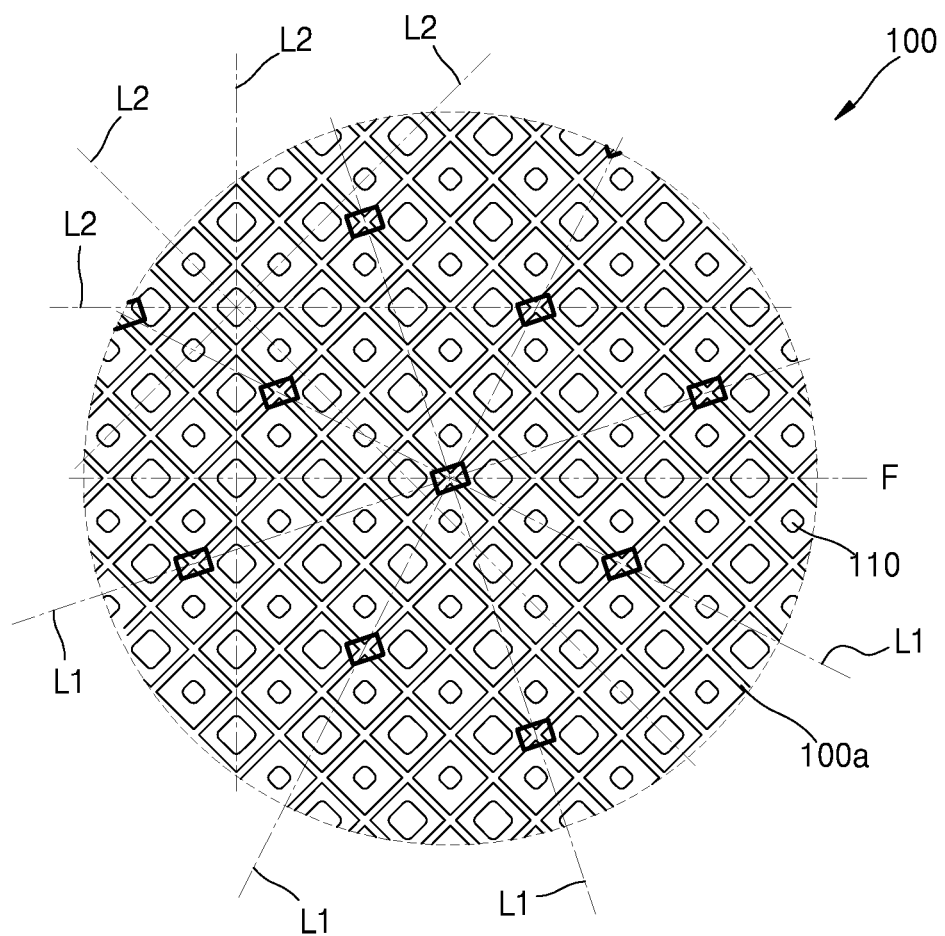
FIG. 7 is a plan view of a modified example of an arrangement of spacers illustrated in FIG. 5.

The present embodiment illustrates a case in which four spacers 120 are arranged to surround approximate 4×4 areas, i.e., two spacers are at a distance from each other of the lengthwise diagonal drawn through four pixels in a row. However, the spacers 120 may be arranged to surround approximate 3×3 areas as illustrated in FIG. 7. That is, the many-to-one correspondence between the pixels 110 and the spacers 120 may vary.

The foldable display apparatus described above may effectively prevent the occurrence of cracks in the folding portion 100a in the panel body 100, even if folding and unfolding are repeated, so as to prevent defects, and to stabilize product quality.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A foldable display apparatus comprising:
    a panel body comprising a folding portion which is foldable with respect to a folding axis, a plurality of pixels arranged in the panel body, and a plurality of spacers arranged between respective ones of the plurality of pixels of the panel body,
    wherein a first arrangement line connecting the plurality of spacers in the folding portion via a virtual straight line is not parallel to the folding axis.

2. The foldable display apparatus of claim 1, wherein a number of the plurality of spacers arranged in a line parallel to the folding axis in the folding portion is equal to or less than two.

3. The foldable display apparatus of claim 1, wherein a second arrangement line connecting the plurality of pixels in the folding portion via a virtual straight line is not parallel to the first arrangement line.

4. The foldable display apparatus of claim 3, wherein the plurality of pixels and the two or more spacers are arranged in a plurality-to-one correspondence.

5. The foldable display apparatus of claim 3, wherein the plurality of pixels comprise a pixel-defining layer defining an emission area, and a thin film encapsulation layer covering and protecting the emission area, and
    the two or more spacers are arranged between the pixel-defining layer and the thin film encapsulation layer.

6. The foldable display apparatus of claim 5, wherein the thin film encapsulation layer comprises a multi-layer in which an organic layer and an inorganic layer are stacked.

7. The foldable display apparatus of claim 5, wherein the thin film encapsulation layer comprises a single inorganic layer.

8. The foldable display apparatus of claim 3, wherein the first arrangement line and the second arrangement line maintain the same arrangement pattern in areas except for the folding portion of the panel body.

9. The foldable display apparatus of claim 3, wherein the first arrangement line and the second arrangement line have a different arrangement pattern in areas except for the folding portion of the panel body.

10. The foldable display apparatus of claim 1, wherein the plurality of spacers are configured to mount a deposition mask.

11. A method of manufacturing a foldable display apparatus, the method comprising:
    forming a plurality of pixels in a panel body comprising a folding portion foldable with respect to a folding axis; and
    forming a plurality of spacers between respective ones of the plurality of pixels of the panel body,
    wherein a first arrangement line connecting the plurality of spacers in the folding portion via a virtual straight line is not parallel to the folding axis.

12. The method of claim 11, wherein a number of the two or more spacers arranged in a line parallel to the folding axis in the folding portion is equal to or less than two.

13. The method of claim 11, wherein a second arrangement line connecting the plurality of pixels in the folding portion via a virtual straight line is not parallel to the first arrangement line.

14. The method of claim 13, wherein the plurality of pixels and the plurality of spacers are arranged in a plurality-to-one correspondence.

15. The method of claim 13, wherein the plurality of pixels comprise a pixel-defining layer defining an emission area, and a thin film encapsulation layer covering and protecting the emission area, and
    the plurality of spacers are arranged between the pixel-defining layer and the thin film encapsulation layer.

16. The method of claim 15, wherein the thin film encapsulation layer comprises a multi-layer in which an organic layer and an inorganic layer are stacked.

17. The method of claim 15, wherein the thin film encapsulation layer comprises a single inorganic layer.

18. The method of claim 13, wherein the first arrangement line and the second arrangement line maintain the same arrangement pattern in areas except for the folding portion of the panel body.

19. The method of claim 13, wherein the first arrangement line and the second arrangement line have a different arrangement pattern in areas except for the folding portion of the panel body.

20. The method of claim 11, wherein the two or more spacers are configured to mount a deposition mask.

* * * * *